US012593708B2

(12) United States Patent
Kim

(10) Patent No.: US 12,593,708 B2
(45) Date of Patent: Mar. 31, 2026

(54) SEMICONDUCTOR PACKAGE INCLUDING STACKED SEMICONDUCTOR DEVICES AND METHOD OF MANUFACTURING THE SEMICONDUCTOR PACKAGE

(71) Applicant: SAMSUNG ELECTRONICS CO., LTD., Suwon-si (KR)

(72) Inventor: Hyunsu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 358 days.

(21) Appl. No.: 18/191,248

(22) Filed: Mar. 28, 2023

(65) Prior Publication Data

US 2024/0063102 A1 Feb. 22, 2024

(30) Foreign Application Priority Data

Aug. 19, 2022 (KR) ........................ 10-2022-0104169

(51) Int. Cl.
*H01L 21/56* (2006.01)
*H01L 23/00* (2006.01)
(Continued)

(52) U.S. Cl.
CPC ...... *H01L 23/49822* (2013.01); *H01L 21/565* (2013.01); *H01L 23/3128* (2013.01);
(Continued)

(58) Field of Classification Search
CPC ............. H01L 23/49822; H01L 21/565; H01L 23/3128; H01L 23/5386; H01L 23/5389;
(Continued)

(56) References Cited

U.S. PATENT DOCUMENTS 8,436,465 B2 5/2013 Sugaya
9,269,647 B2 2/2016 Du
(Continued)

FOREIGN PATENT DOCUMENTS

JP 2010-080651 A 4/2010
KR 10-2008-0111618 12/2008
(Continued)

OTHER PUBLICATIONS

Office Action dated Jan. 29, 2026 issued in corresponding to Korean Patent Application No. 10-2022-0104169.

*Primary Examiner* — Walter H Swanson
(74) *Attorney, Agent, or Firm* — Morgan, Lewis & Bockius LLP

(57) ABSTRACT

A semiconductor package includes a first package substrate. A first semiconductor device is mounted on an upper surface of the first package substrate. A first molding is disposed on the first package substrate and covers the first semiconductor device. A second package substrate is disposed on the first molding. At least one second semiconductor device is mounted on an upper surface of the second package substrate. A second molding covers the second semiconductor device. The second molding has a marking pattern in the first region. The second molding has an uneven structure having a plurality of trenches that define a plurality of column structures protruding from a second region on the second semiconductor device.

19 Claims, 17 Drawing Sheets

(51) Int. Cl.

| | |
|---|---|
| *H01L 23/31* | (2006.01) |
| *H01L 23/498* | (2006.01) |
| *H01L 23/538* | (2006.01) |
| *H01L 23/544* | (2006.01) |
| *H01L 25/065* | (2023.01) |
| *H01L 25/10* | (2006.01) |

(52) U.S. Cl.

CPC ...... *H01L 23/5386* (2013.01); *H01L 23/5389* (2013.01); *H01L 23/544* (2013.01); *H01L 24/16* (2013.01); *H01L 24/48* (2013.01); *H01L 24/73* (2013.01); *H01L 25/0657* (2013.01); *H01L 25/105* (2013.01); *H01L 2223/54433* (2013.01); *H01L 2224/16225* (2013.01); *H01L 2224/48227* (2013.01); *H01L 2224/73204* (2013.01); *H01L 2224/73265* (2013.01); *H01L 2225/06513* (2013.01); *H01L 2225/1058* (2013.01)

(58) Field of Classification Search

CPC ....... H01L 23/544; H01L 24/16; H01L 24/48; H01L 24/73; H01L 25/0657; H01L 25/105

See application file for complete search history.

(56) References Cited

U.S. PATENT DOCUMENTS

| | | | |
|---|---|---|---|
| 9,865,570 | B1 | 1/2018 | England et al. |
| 10,937,668 | B2 | 3/2021 | Kim et al. |
| 2009/0146284 | A1 | 6/2009 | Kim et al. |
| 2014/0374922 | A1* | 12/2014 | Huang ............. H01L 23/49811 |
| | | | 438/109 |
| 2022/0068818 | A1 | 3/2022 | Song et al. |

FOREIGN PATENT DOCUMENTS

| | | | |
|---|---|---|---|
| KR | 10-2017-0041516 A | | 4/2017 |
| KR | 10-2019-0130950 A | | 11/2019 |
| KR | 10-2019-0133907 A | | 12/2019 |

* cited by examiner

SEMICONDUCTOR PACKAGE INCLUDING STACKED SEMICONDUCTOR DEVICES AND METHOD OF MANUFACTURING THE SEMICONDUCTOR PACKAGE

CROSS-REFERENCE TO RELATED APPLICATION

This application claims priority under 35 U.S.C. § 119 to Korean Patent Application No. 10-2022-0104169, filed on Aug. 19, 2022 in the Korean Intellectual Property Office (KIPO), the contents of which are herein incorporated by reference in their entirety.

TECHNICAL FIELD

The present disclosure relates to a semiconductor package and, more specifically, to a semiconductor package including a plurality of stacked semiconductor devices and a method of manufacturing the same.

DISCUSSION OF THE RELATED ART

Package on package (PoP) technology is an integrated circuit packaging method in which various different semiconductor packages are stacked on one another. By stacking multiple different semiconductor packages in this manner, device sized may be reduced and performance may be increased. As the number of semiconductor chips within the stack increases, heat generated inside the semiconductor package increases. As a structure of the semiconductor package becomes more complicated, it is more difficult to dissipate heat within a PoP device.

SUMMARY

A semiconductor package includes a first package substrate. A first semiconductor device is mounted on an upper surface of the first package substrate. A first molding is disposed on the first package substrate and covers the first semiconductor device. A second package substrate is disposed on the first molding. At least one second semiconductor device is mounted on an upper surface of the second package substrate. A second molding covers the second semiconductor device. The second molding has a marking pattern in the first region thereof. The second molding has an uneven structure having a plurality of trenches that define a plurality of column structures protruding from a second region on the second semiconductor device.

A method of manufacturing a semiconductor package includes sequentially disposing a first semiconductor device and an interposer on a first package substrate. A second package substrate is disposed on the interposer via conductive bumps. A second semiconductor device is disposed on the second package substrate and a molding covers the second semiconductor device. A marking pattern is formed by a first laser beam on a first region of an upper surface of the molding. An uneven structure is formed by a second laser beam on a second region of the upper surface of the molding.

A method of manufacturing a semiconductor package includes disposing an interposer on a first package substrate on which a first semiconductor device is stacked. A second package substrate on which a second semiconductor device is stacked is disposed on the interposer. A molding is formed on the second package substrate and covers the second semiconductor device. A marking pattern is formed by a first laser beam having a first intensity on a first region of an upper surface of the molding. An uneven structure is formed by a second laser beam, having a second intensity that is greater than the first intensity, on a second region of the upper surface of the molding.

A semiconductor package includes a first package substrate. A first semiconductor device id mounted on an upper surface of the first package substrate. A first molding is disposed on the first package substrate and covers the first semiconductor device. A second package substrate is disposed on the first molding. At least one second semiconductor device is mounted on an upper surface of the second package substrate. A second molding covers the second semiconductor device. The second molding has a marking pattern in the first region. The second molding has an uneven structure having a plurality of trenches that define a plurality of column structures protruding from a second region on the second semiconductor device.

BRIEF DESCRIPTION OF THE DRAWINGS

Example embodiments will be more clearly understood from the following detailed description taken in conjunction with the accompanying drawings, wherein:

FIG. 2 is a cross-sectional view taken along the line A-A' in FIG. 1;

Figure 10:
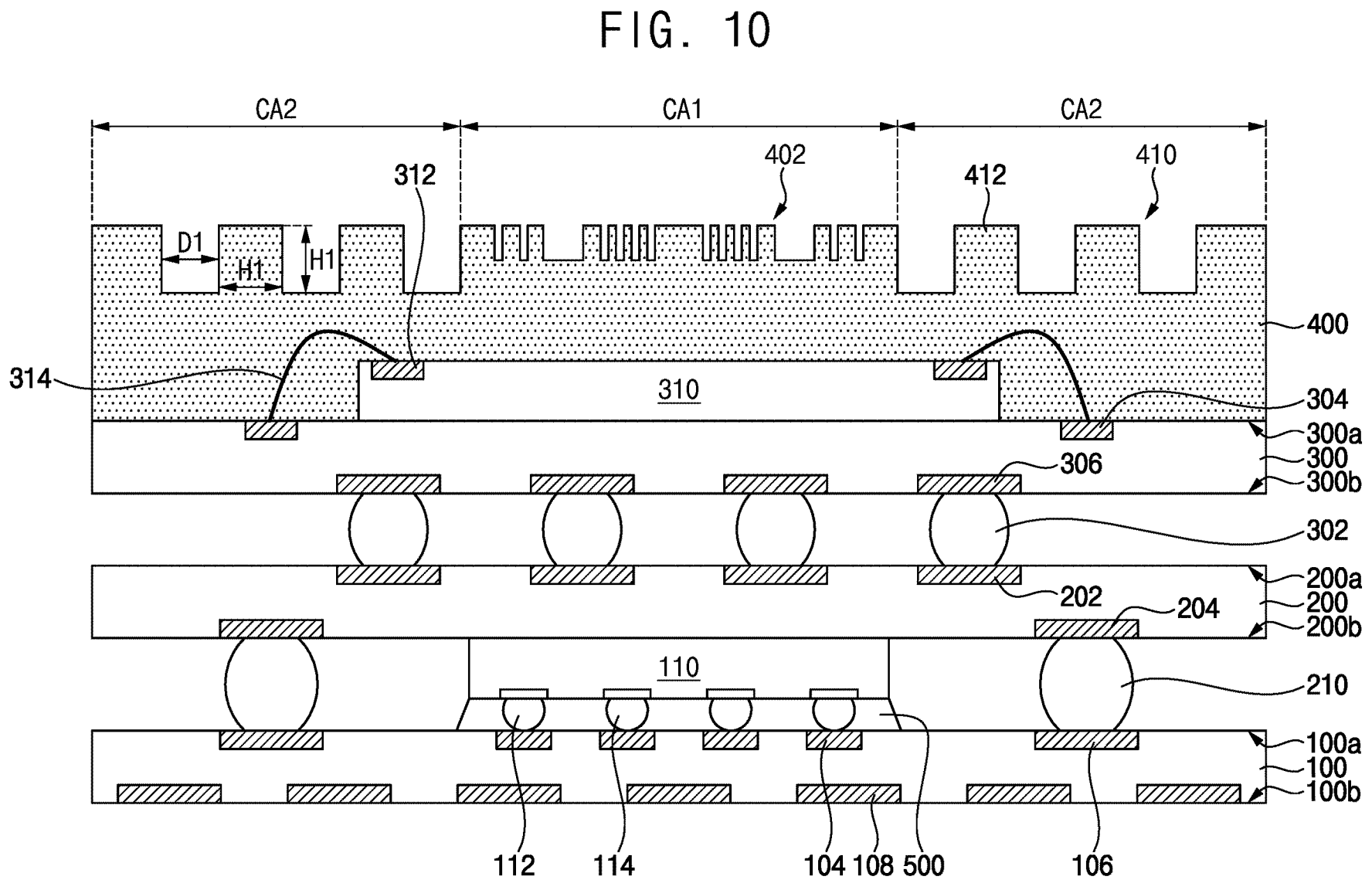

FIGS. 3 to 6, 8, 10, 12, 14, 16, and 17 are cross-sectional views illustrating a method of manufacturing a semiconductor package in accordance with example embodiments.

DETAILED DESCRIPTION OF EXAMPLE EMBODIMENTS

Hereinafter, example embodiments will be explained in detail with reference to the accompanying drawings.

Figure 1:
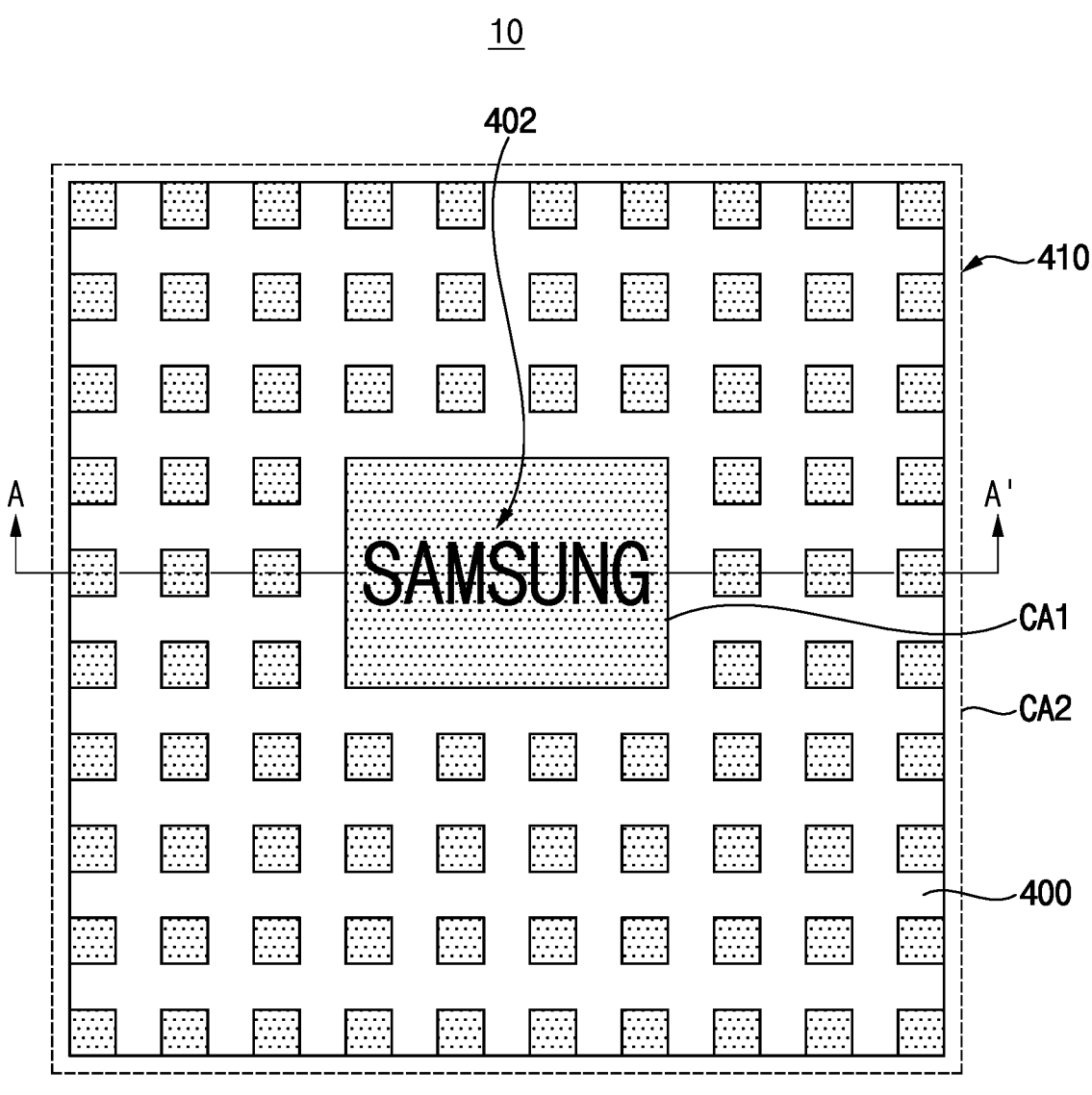
FIG. 1 is a plan view illustrating a semiconductor package in accordance with example embodiments.
Figure 2:
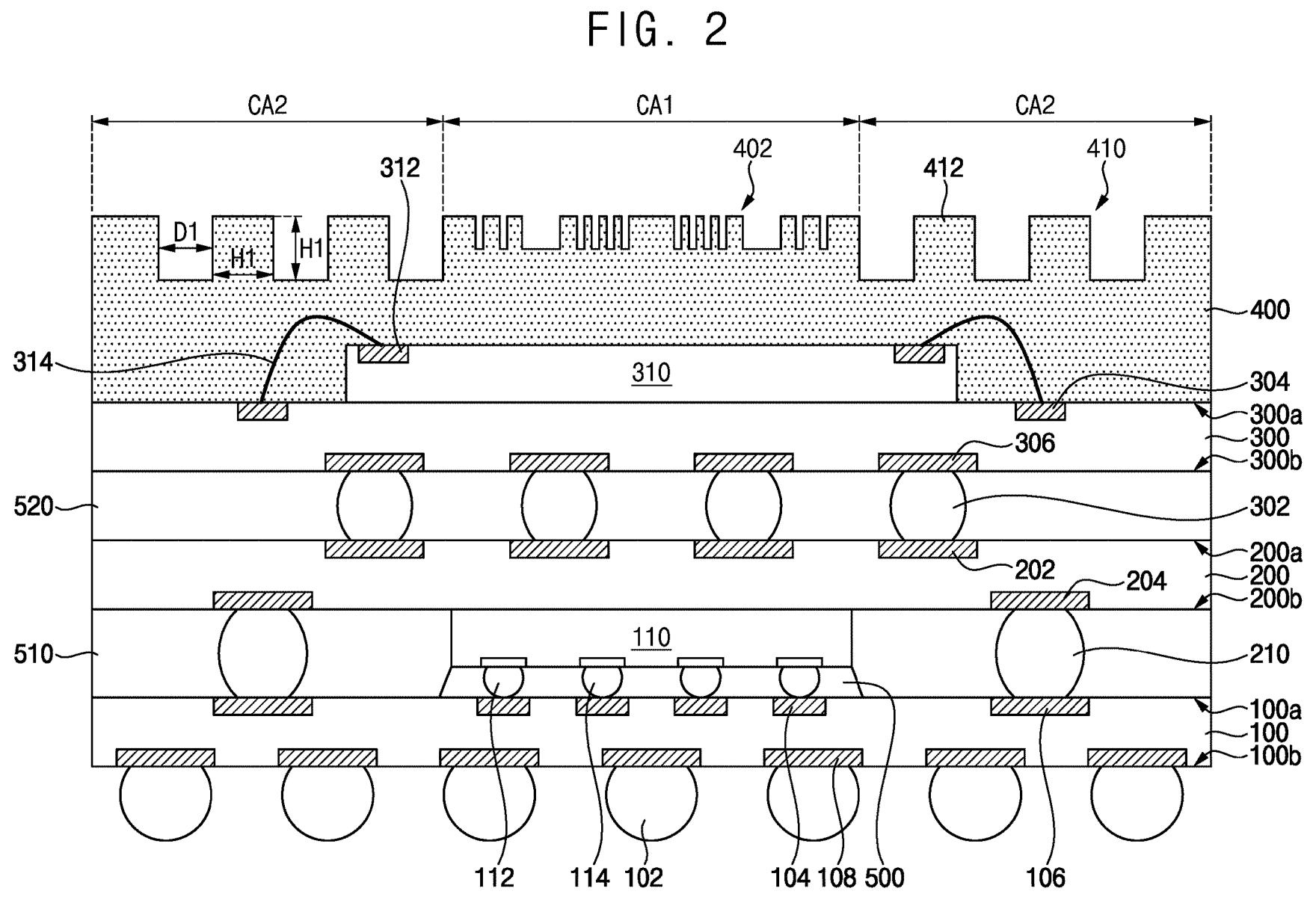

FIG. 1 is a plan view illustrating a semiconductor package in accordance with example embodiments. FIG. 2 is a cross-sectional view taken along the line A-A' in FIG. 1.

Referring to FIGS. 1 and 2, a semiconductor package 10 may include a first package substrate 100, a first semiconductor device 110 disposed on the first package substrate 100, an interposer 200, a second package substrate 300 disposed on the interposer 200, a second semiconductor device 310 disposed on the second package substrate 300, and a molding 400 covering the second semiconductor device 310 on the second package substrate 300. The semiconductor package 10 may further include conductive structures 210 electrically connecting the first package substrate 100 and the interposer 200 to one another.

In example embodiments, the semiconductor package 10 may include a semiconductor module having a Package on Package (PoP) structure in which a plurality of semiconductor devices is stacked. The semiconductor package 10 may include an interposer package on package (IPOP) structure including the interposer 200. For example, the first semiconductor device 110 may include a logic semiconductor device, and the second semiconductor device 310 may include a memory semiconductor device. The logic semiconductor device may be an ASIC as a host such as a CPU, GPU, or SoC. The memory semiconductor device may include a high bandwidth memory (HBM) device, a dynamic random access memory (DRAM), and the like.

In example embodiments, the first package substrate 100 may include a first upper surface 100a and a first lower surface 100b that are opposite to each other. The first package substrate 100 may include a plurality of first and second substrate pads 104, 106 exposed from the first upper surface 100a, and a plurality of third substrate pads 108 exposed from the first lower surface 100b.

For example, the first package substrate 100 may be a printed circuit board (PCB). The printed circuit board may be a multilayer circuit board having vias and various circuits therein. The first to third substrate pads 104, 106, 108 may be electrically connected to each other through the circuits inside the first package substrate 100. The first package substrate 100 may provide high-density interconnection between the first and second semiconductor devices 110, 310 through the circuits.

The first package substrate 100 may further include first conductive bumps 102 configured to electrically connect with other semiconductor devices. The first conductive bumps 102 may be respectively disposed on the third substrate pads 108. For example, the first conductive bump 102 may include a C4 bump.

The first semiconductor device 110 may include a plurality of solder bumps 114 respectively disposed on the plurality of first chip pads 112 on a lower surface. The first semiconductor device 110 may be mounted on the first package substrate 100 via the solder bumps 114, and may be electrically connected to the first package substrate 100. The solder bumps 114 of the first semiconductor device 110 may be bonded to and electrically connected to the first substrate pads 104 of the first package substrate 100. For example, the solder bumps 114 may include micro bumps (uBumps).

In example embodiments, the conductive structures 210 may be disposed between the first package substrate 100 and the interposer 200 and may electrically connect the first package substrate 100 and the interposer 200 to one another. The conductive structures 210 may be respectively disposed on the second substrate pads 106 of the first package substrate 100. The conductive structures 210 may be electrically connected to the first semiconductor device 110 through the first package substrate 100. The conductive structure 210 may provide a signal movement path for electrically connecting the first and second semiconductor devices 110, 310. For example, the conductive structure 210 may have a bump shape or a pillar shape.

In example embodiments, the interposer 200 may have a third upper surface 200a and a third lower surface 200b opposite to each other. The interposer 200 may include a plurality of first bonding pads 202 exposed from the third upper surface 200a and a plurality of second bonding pads 204 exposed from the third lower surface 200b. The first and second bonding pads 202, 204 may be electrically connected to each other. The interposer 200 may electrically connect the first and second package substrates 100, 300 to each other.

The interposer 200 may be disposed on the first upper surface 100a of the first package substrate 100 via the conductive structures 210. The second bonding pads 204 of the interposer 200 may contact the conductive structures 210 and may be electrically connected to each other.

In example embodiments, the second package substrate 300 may include a second upper surface 300a and a second lower surface 300b opposite to each other. The second package substrate 300 may include a plurality of fourth substrate pads 304 exposed from the second upper surface 300a and a plurality of fifth substrate pads 306 exposed from the second lower surface 300b.

For example, the second package substrate 300 may be the printed circuit board (PCB). The printed circuit board may be a multilayer circuit board having vias and various circuits therein. The fourth and fifth substrate pads 304, 306 may be electrically connected to each other through the circuits inside the second package substrate 300. The second package substrate 300 may provide a high-density interconnection between the first and second semiconductor devices 110, 310 through the circuits.

The second package substrate 300 may further include second conductive bumps 302 electrically connected to the interposer 200. The second conductive bumps 302 may be respectively disposed on the fifth substrate pads 306. The second conductive bumps 302 may be disposed between the fifth substrate pad 306 of the second package substrate 300 and the first bonding pad 202 of the interposer 200 to electrically connect them to each other. For example, the second conductive bump 302 may include a C4 bump.

The second semiconductor device 310 may include a plurality of second chip pads 312 disposed on an upper surface, and a plurality of bonding wirings 314 respectively extending from the second chip pads 312. The second semiconductor device 310 may be mounted on the second package substrate 300 and may be electrically connected to the second package substrate 300 through bonding wirings 314. The bonding wirings 314 of the second semiconductor device 310 may be respectively bonded to the fourth substrate pads 304 of the second package substrate 300 and electrically connected to each other.

In example embodiments, the molding 400 may cover the second semiconductor device 310 on the second package substrate 300. The molding 400 may dissipate heat generated from the first package substrate 100, the first semiconductor device 110, the interposer 200, the second package substrate 300 and the second semiconductor device 310 to an upper surface of the molding 400.

The molding 400 may include a marking pattern 402 in a first region CA1. The marking pattern 402 may include an engraved pattern having a plurality of first trenches recessed from the upper surface of the molding 400. For example, the engraved pattern may display a manufacturer name, date of manufacture, serial number, and/or the like. The marking pattern 402 may be formed by a first laser beam.

The molding 400 may include an uneven structure 410 for dissipating heat to an upper surface of a second region CA2. The uneven structure 410 may increase a contact area with air in order to dissipate heat more efficiently. The uneven structure 410 may include second trenches that are deeper and wider than the first trenches of the marking pattern 402. For example, the uneven structure 410 may be formed by a second laser beam that is different from the first laser beam.

The uneven structure 410 of the molding 400 may include a plurality of column structures 412 disposed on the upper surface of the molding 400. The column structures 412 may be defined by the second trenches. The column structures 412 may better dissipate heat externally by increasing a contact area with air.

Since the column structures 412 are manufactured by the second laser beam, the column structures 412 may be of a very small size. When the column structures 412 are manufactured in very small sizes, the contact area with air may be substantially increased. The column structure 412 may have a first height H1 and a first width T1. For example, the first height H1 may be within a range of 10 μm to 30 μm. The first width T1 may be within a range of 15 μm to 50 μm. The first distance D1 between the column structures 412 may be within a range of 15 μm to 50 μm.

The column structure 412 may have an exposed upper surface and a lower surface opposite to the upper surface. An area A1 of the upper surface of the column structure 412 may be smaller than an area A2 of the lower surface. Heat might not reach the upper surface of the column structure 412 to the same extent that it reaches the lower surface. The column structure 412 may efficiently dissipate heat through the area A1 of the upper surface that is smaller than the area A2 of the lower surface. For example, a ratio (A1/A2) of the area A1 of the upper surface and the area A2 of the lower surface may be within a range of 0.5 to 0.9.

For example, the column structure 412 may include a circular cone shape, a quadrilateral pyramid shape, a hemisphere shape, a circular truncated cone shape, and/or a frustum of quadrilateral pyramid shape.

The column structures 412 of the uneven structure 410 may be concentrated on a heat dissipation region on the molding 400. The heat dissipation region may be disposed in the second region CA2. The heat dissipation region is a region where heat is intensively generated from the first package substrate 100, the second semiconductor device 310, the interposer 200, the second package substrate 300, and the second semiconductor device 310. The column structures 412 of the uneven structure 410 may be concentrated in the heat dissipation region, such that heat is more efficiently dissipated. For example, the heat dissipation region may be an area where the molding 400 covers the second semiconductor device 310.

The uneven structure 410 of the molding 400 may include a plurality of rod structures 416 extending parallel to each other in a longitudinal direction of the molding 400 from the upper surface. Since the rod structures 416 all extend in one direction, the rod structures 416 may be stronger than the column structures 412. Since the rod structures 416 are stronger than the column structures 412, the rod structures 416 may have a smaller size. The rod structures 416 may have the small size to increase a contact area with air.

For example, the molding 400 may include an epoxy molding compound (EMC). The molding 400 may include epoxy resin, UV resin, polyurethane resin, silicone resin, and/or silica filler.

As described above, heat emitted from the stacked first package substrate 100, the first semiconductor device 110, the interposer 200, the second package substrate 300, and the second semiconductor device 310 may be dissipated through the molding 400. The uneven structure 410 formed on the molding 400 may increase the surface area in contact with air, and the uneven structure 410 may more efficiently dissipate heat generated from the semiconductor package 10. Since the uneven structure 410 is formed as a result of the use of the second laser beam, it is possible to form a fine structure that effectively increases the surface area in contact with air.

Hereinafter, a method of manufacturing the semiconductor package in FIG. 1 will be described.

Figure 6:
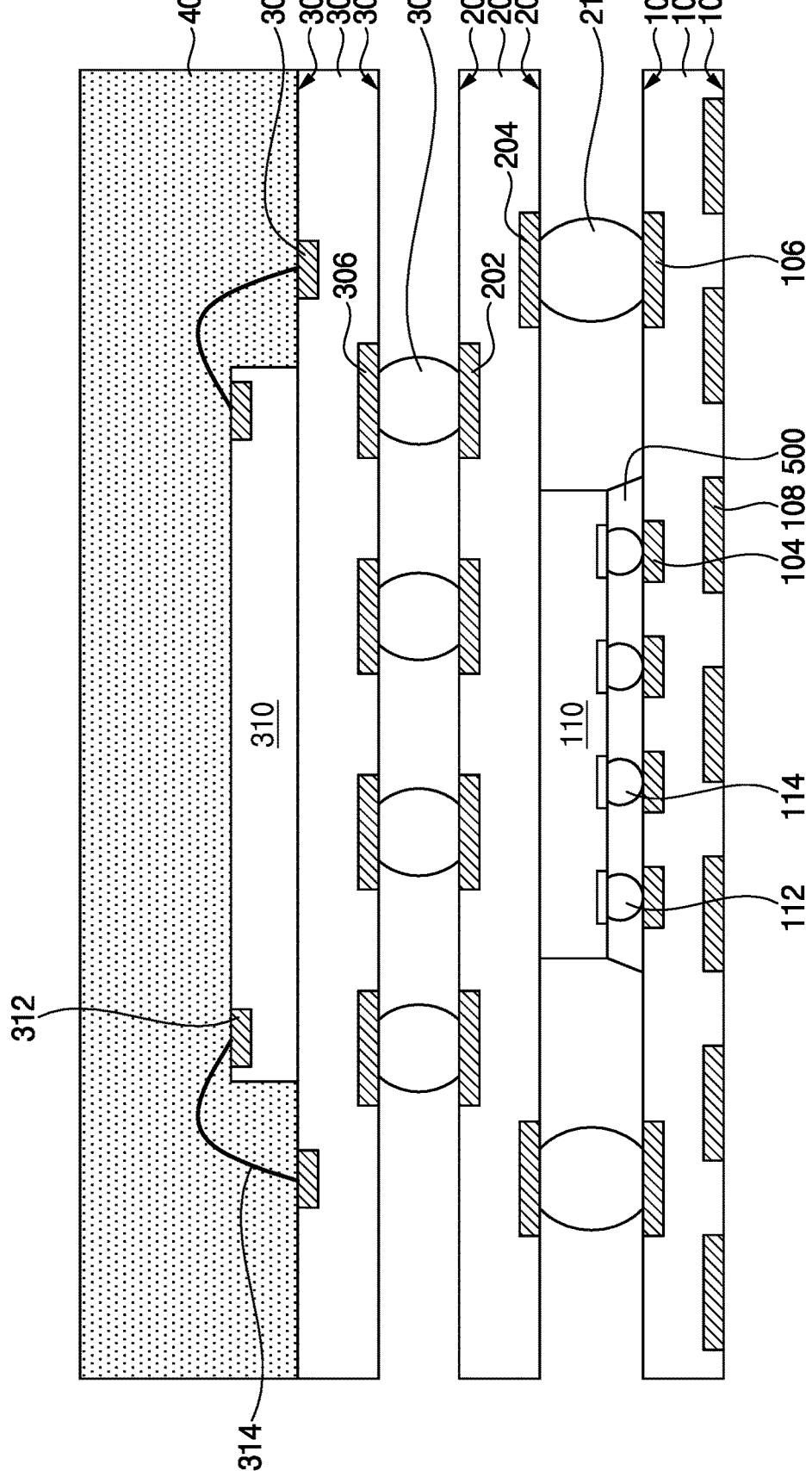
Figure 7:
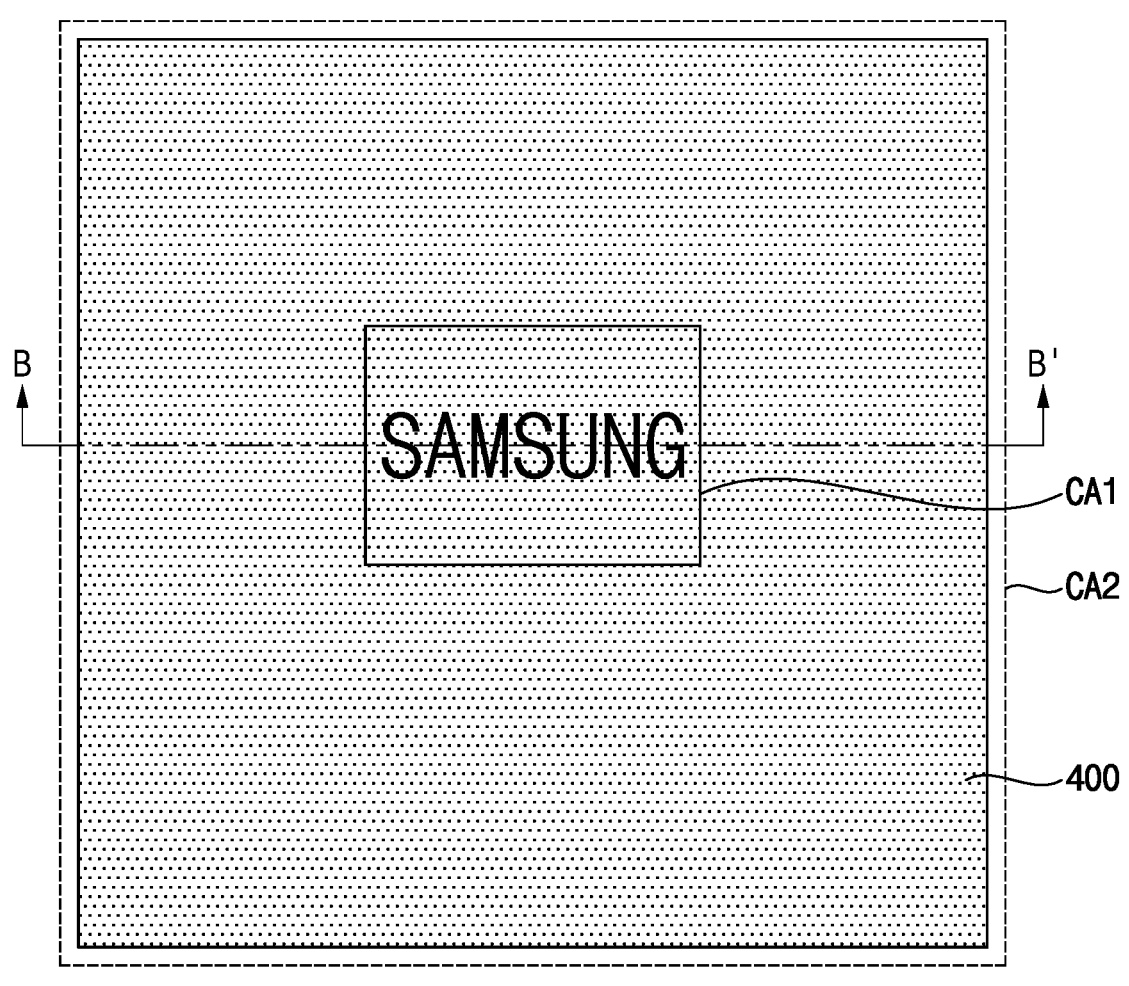
FIGS. 7, 9, 11, 13, and 15 are plan views illustrating a method of manufacturing a semiconductor package in accordance with example embodiments.
Figure 8:
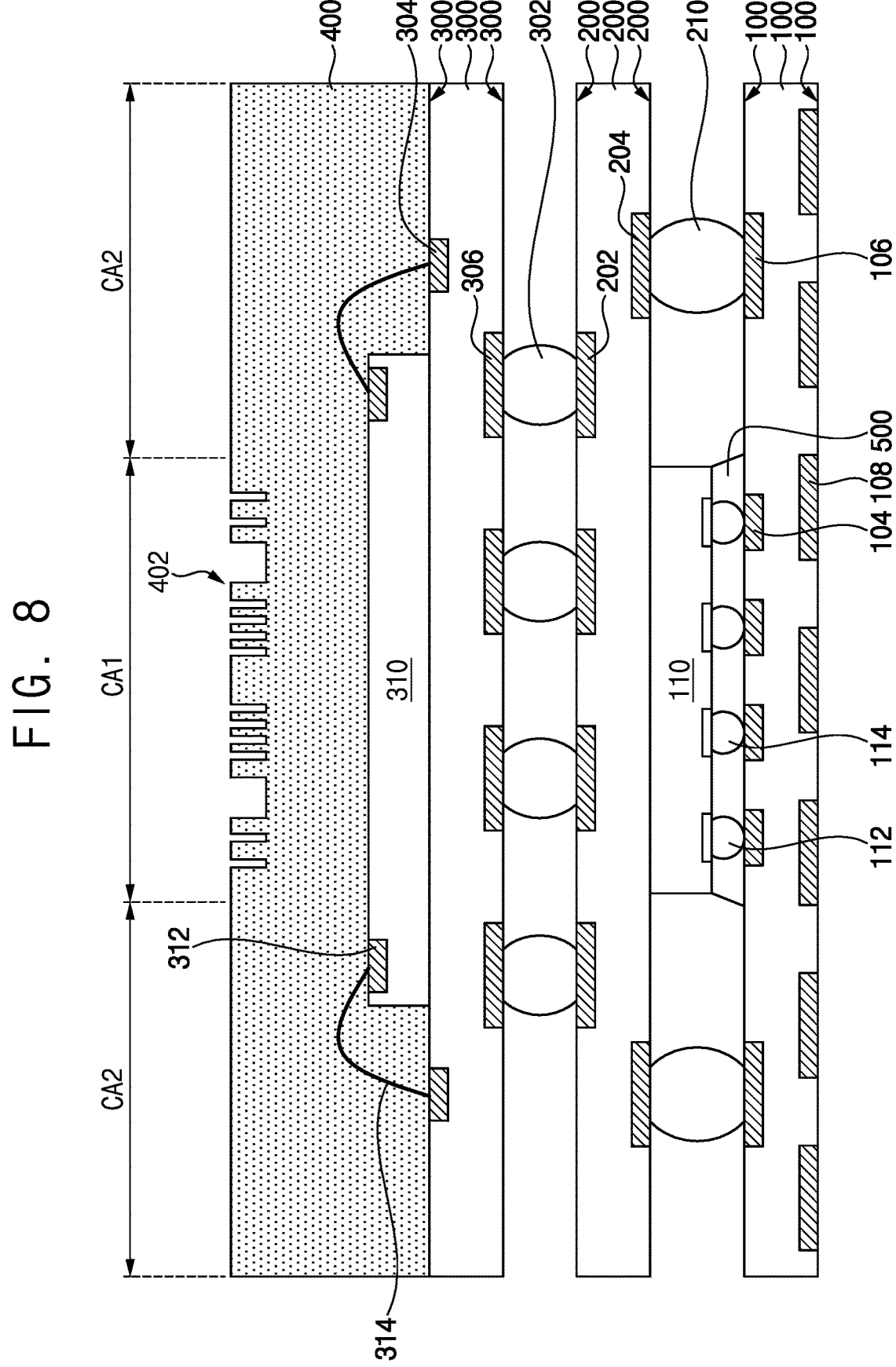
Figure 9:
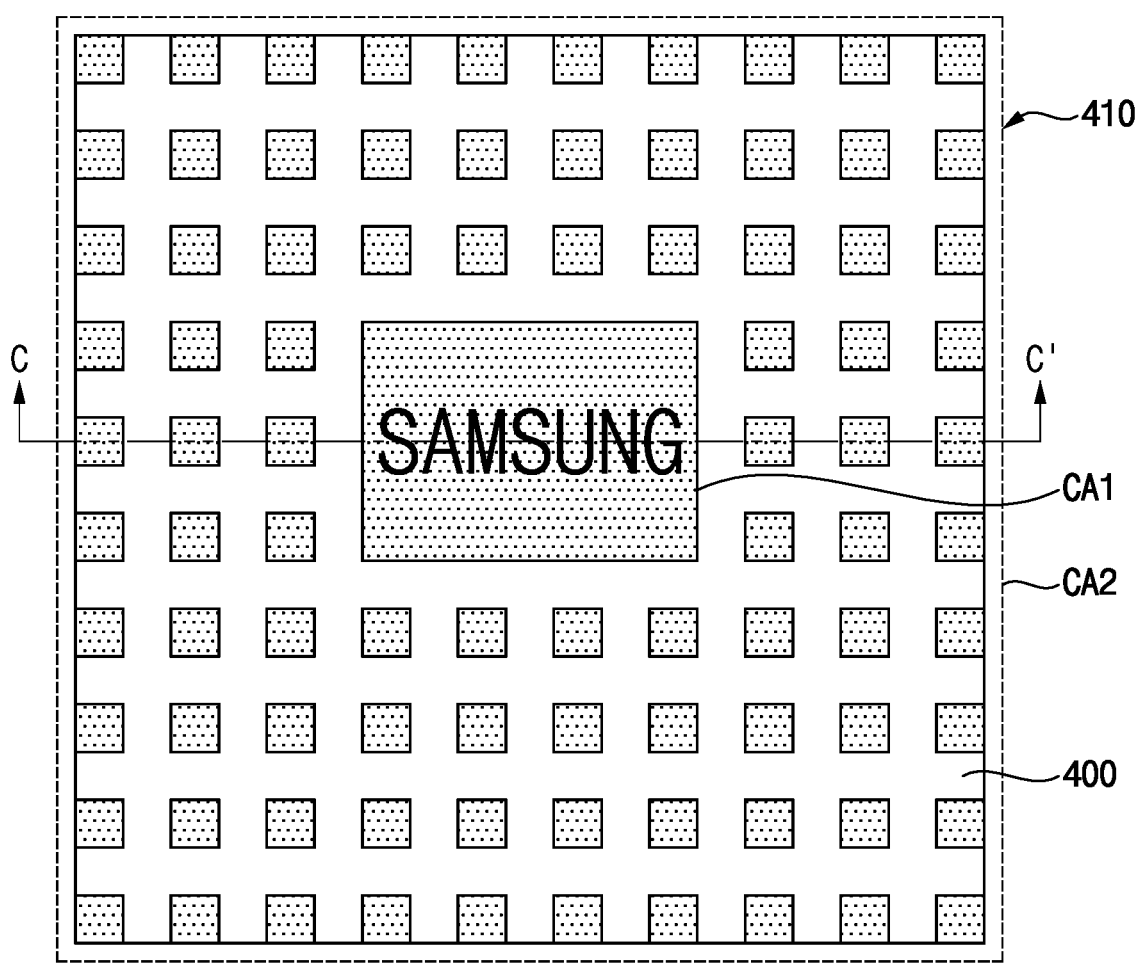

FIGS. 3, 6, 8, 10, 12, 14, 16, and 17 are cross-sectional views and FIGS. 7, 9, 11, 13, and 15 are plan views, illustrating a method of manufacturing a semiconductor package in accordance with example embodiments. In particular, FIG. 7 is a plan view illustrating a semiconductor package including a molding having a marking pattern in accordance with example embodiments. FIG. 8 is a cross-sectional view taken along the line B-B' in FIG. 7. FIG. 9 is a plan view illustrating a semiconductor package including a molding having an uneven structure in accordance with example embodiments. FIG. 10 is a cross-sectional view taken along the line C-C' in FIG. 9.

Figure 3:
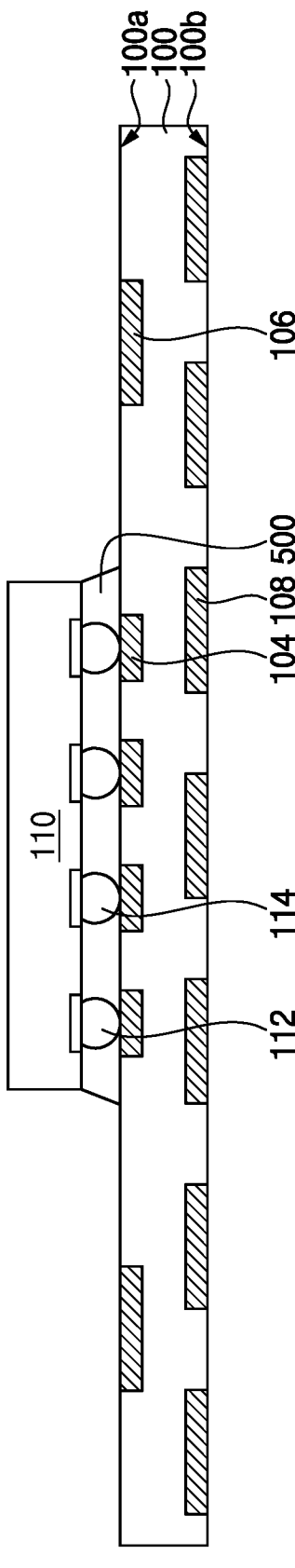

Referring to FIG. 3, a first semiconductor device 110 may be mounted on a first package substrate 100.

In example embodiments, the first package substrate 100 having a plurality of first to third substrate pads 104, 106, 108 may be formed. For example, the first package substrate 100 may be a printed circuit board (PCB). The printed circuit board may be a multilayer circuit board having vias and various circuits therein.

The first semiconductor device 110 may be mounted on the first package substrate 100 by a flip chip bonding method. The first semiconductor device 110 may be attached on the first package substrate 100 by a thermal compression process. Solder bumps 114 disposed on the first chip pads 112 of the first semiconductor device 110 may be bonded to the first substrate pads 104, respectively. For example, the solder bumps 114 may include micro bumps (uBumps).

A first adhesive 500 may be underfilled between the first semiconductor device 110 and the first package substrate 100. The first adhesive 500 may reinforce a gap between the first package substrate 100 and the first semiconductor device 110. For example, the first adhesive 500 may include an epoxy material to reinforce a gap between the first package substrate 100 and the first semiconductor device 110.

Figure 4:
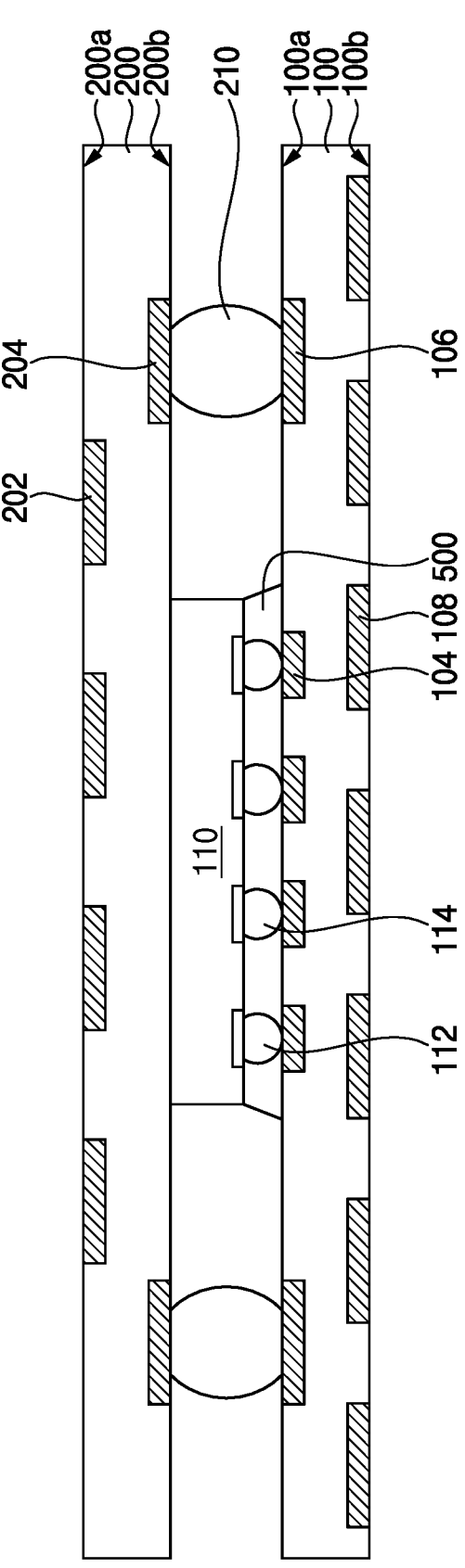

Referring to FIG. 4, an interposer 200 may be mounted on the first package substrate 100.

In example embodiments, the first package substrate 100 and the interposer 200 may be coupled to each other via conductive structures 210. A first bump may be formed on the second substrate pad 106 of the first package substrate 100, and a second bump may be formed on a second bonding pad 204 of the interposer 200. The first bumps of the first package substrate 100 and the second bumps of the interposer 200 may be coupled to each other through a thermal compression process to form the conductive structures 210. The first package substrate 100 and the interposer 200 may be electrically connected to each other through the conductive structures 210.

Figure 5:
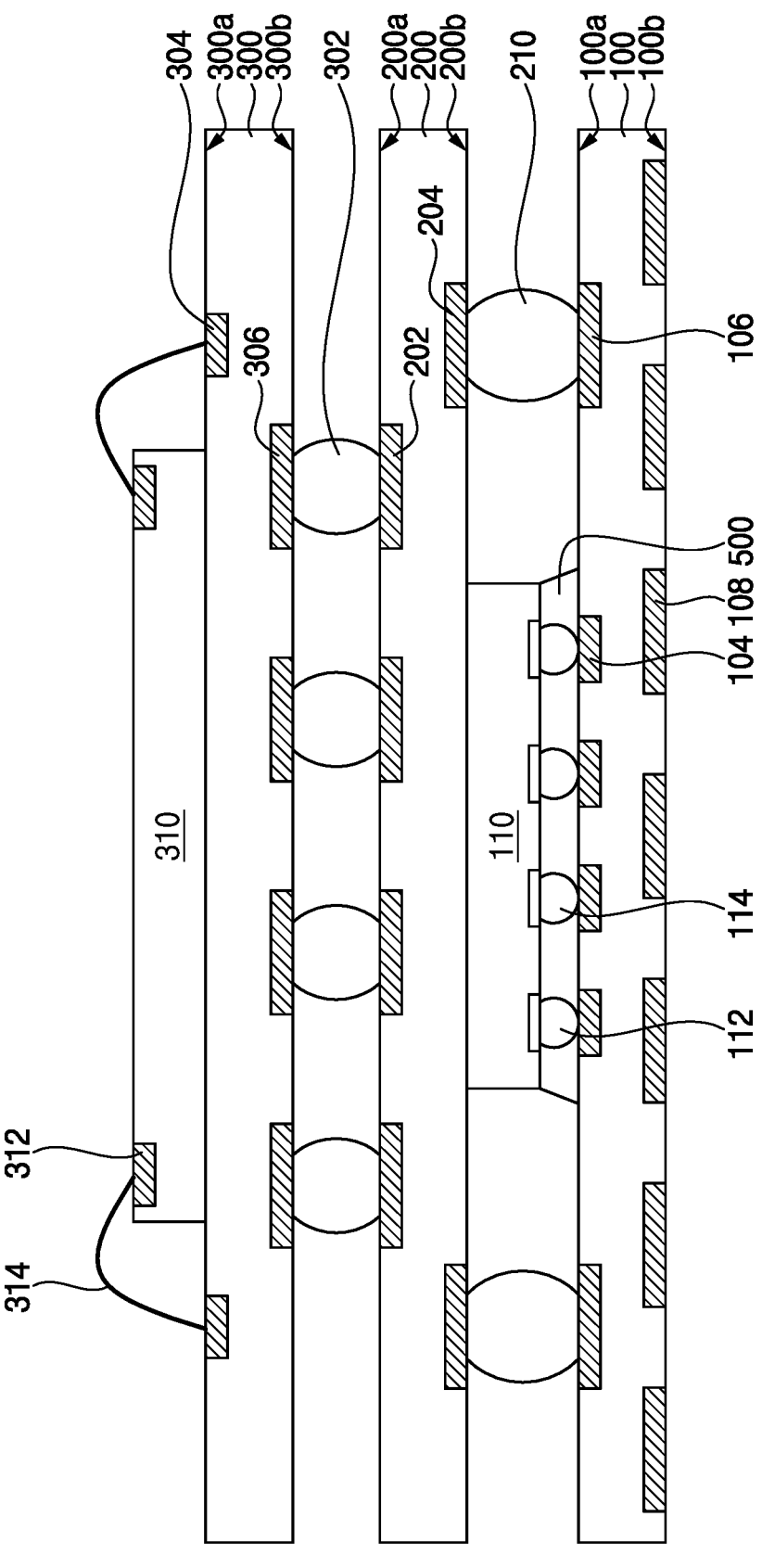

Referring to FIGS. 5 and 6, a second package substrate 300 and a second semiconductor device 310 may be sequentially mounted on the interposer 200, and a molding 400 may be formed on the second package substrate 300 and may cover the second semiconductor device 310.

In example embodiments, the second package substrate 300 having a plurality of fourth and fifth substrate pads 304, 306 may be formed. For example, the second package substrate 300 may be a printed circuit board (PCB). The printed circuit board may be a multilayer circuit board having vias and various circuits therein.

The second semiconductor device 310 may be mounted on the second package substrate 300 by a wire bonding method. The second semiconductor device 310 may be electrically bonded to the fourth substrate pads 304 of the second package substrate 300 via bonding wirings 314 extending from the second chip pads 312.

Then, the molding 400 covering the second semiconductor device 310 may be formed on the second package substrate 300.

For example, the molding 400 may include an epoxy molding compound (EMC). The molding 400 may include epoxy resin, UV resin, polyurethane resin, silicone resin, or silica filler.

An upper surface of the molding 400 may be partially removed by a grinding process such as a chemical mechanical polishing (CMP) process. The upper surface of the molding 400 may be polished in parallel. Accordingly, a thickness of the molding 400 may be reduced to a desired thickness.

Referring to FIGS. 7 and 8, a marking pattern 402 may be formed by a first laser beam onto a first region CA1 of the molding 400.

In example embodiments, the marking pattern 402 may be formed by the first laser beam onto the first region CA1. For example, the first laser beam may have a first intensity. The first laser beam may be applied for a first period of time.

The marking pattern 402 may include an engraved pattern having a plurality of first trenches that are recessed from the upper surface of the molding 400. For example, the engraved pattern may display a manufacturer name, date of manufacture, serial number, and/or the like.

Referring to FIGS. 9 and 10, the uneven structure 410 may be formed by a second laser beam on a second region CA2 of the molding 400.

In example embodiments, the uneven structure 410 may be formed by the second laser beam that is different from the first laser beam on the second region CA2. The uneven structure 410 may increase a contact area with air to dissipate heat more efficiently. The uneven structure 410 may include second trenches that are deeper and wider than the first trenches of the marking pattern 402.

For example, the second laser beam may have a second intensity that is different from the first intensity of the first laser beam. The second intensity may be greater than the first intensity. Alternatively, the second intensity may be the same as the first intensity. In this case, the second laser beam may be applied for a second period of time that is longer than the first period of time of the first laser beam.

The first and second laser beams may be emitted from a light source. The light source may include a solid medium through which the first and second laser beams pass. Properties of the first and second laser beams may vary depending on the solid medium. For example, the solid medium may include neodymium yttrium aluminum garnet compound (Nd:YAG), neodymium yttrium orthovanadate compound (Nd:YVO4), aluminum gallium arsenide compound (AlGaAS), aluminum gallium indium compound (AlGaInP), gallium nitride compound (GaN), neodymium optical fiber (Nd-Fiber), sapphire (Sapphire), and/or the like.

The uneven structure 410 of the molding 400 may include a plurality of column structures 412 formed on the second area CA2. The column structures 412 may be defined by the second trenches. The column structures 412 may dissipate heat from the semiconductor package 10 by increasing an area where the molding 400 is exposed to air. An amount of heat according to the area exposed to air may be expressed as in following Equation (1).

$$q = kA\frac{\Delta T}{L} \qquad \text{Equation (1)}$$

Here, q is the amount of heat, k is a heat transfer coefficient, A is the area exposed to air, L is a thickness, and $\Delta T$ is a temperature difference.

As the area A exposed to air increases, the amount of heat q dissipated through the molding 400 may increase.

Since the column structures 412 are processed by the second laser beam, they may be manufactured in very small sizes. When the column structures 412 are manufactured in the very small sizes, the contact area with air may be substantially increased. The column structure 412 may have a first height H1 and a first width T1. For example, the first height H1 may be within a range of 10 µm to 30 µm. The first width T1 may be within a range of 15 µm to 50 µm. A first distance D1 between the column structures 412 may be within a range of 15 µm to 50 µm.

Figure 11:
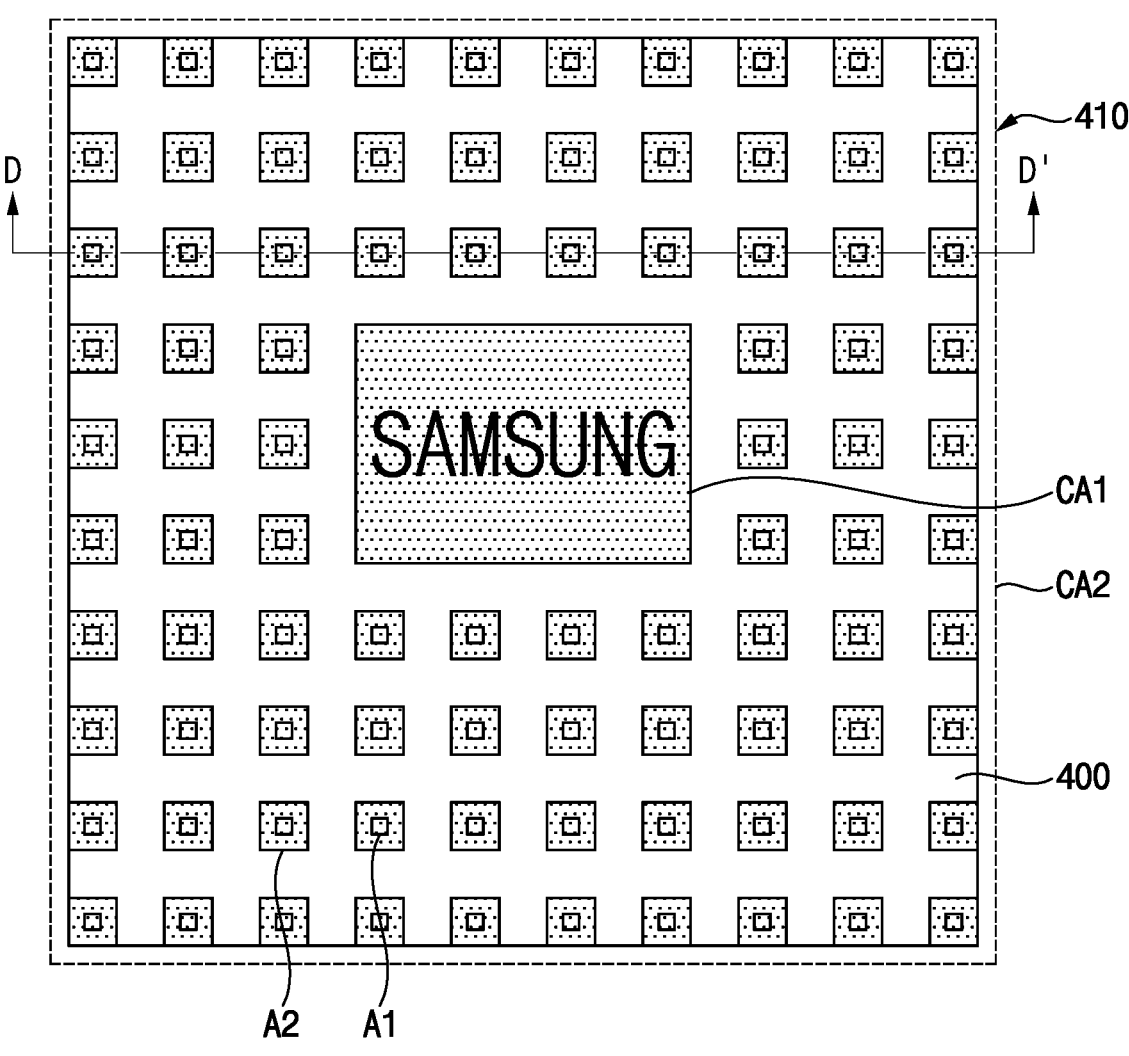
Figure 12:
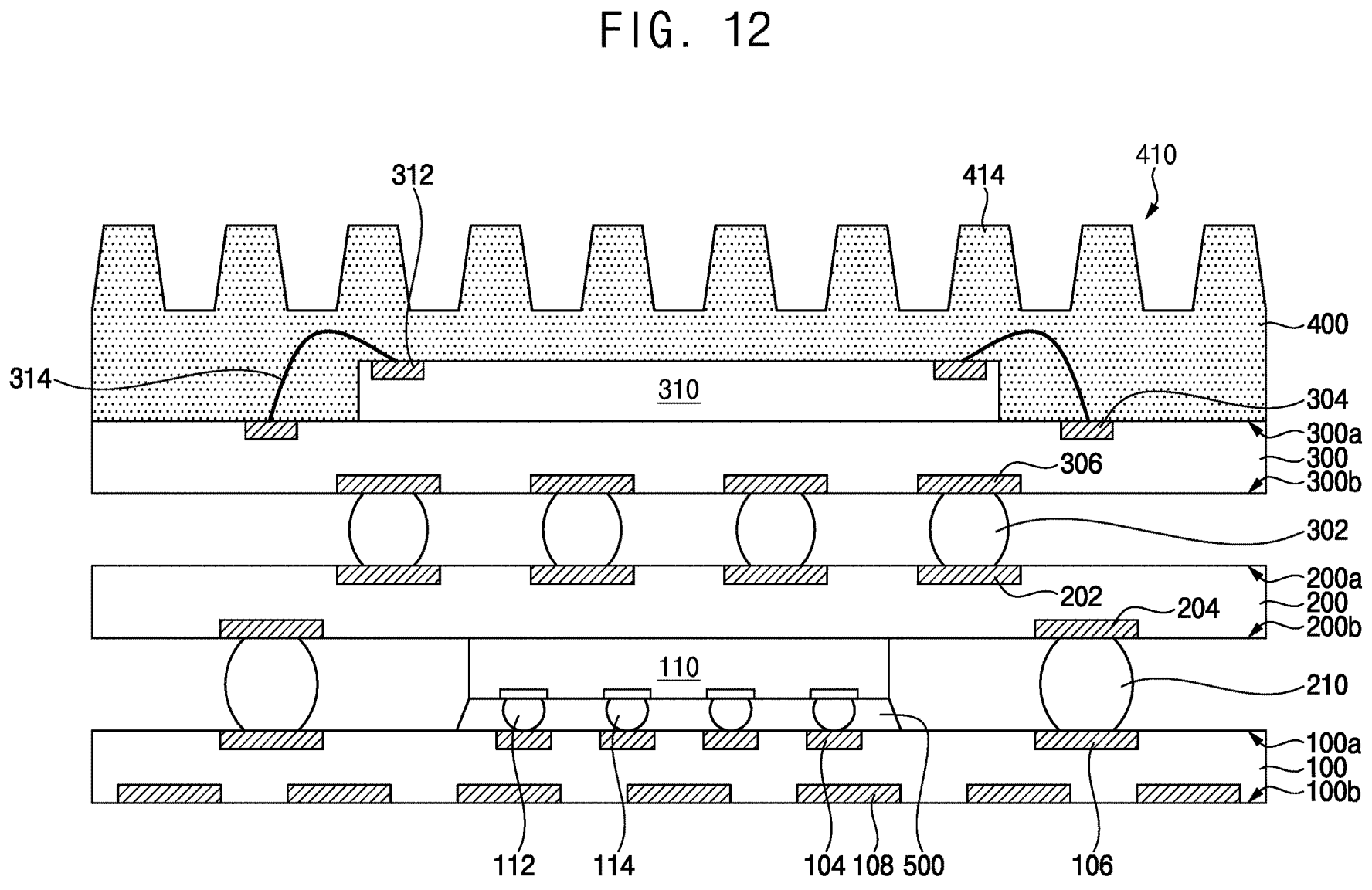

FIG. 11 is a plan view illustrating a semiconductor package including a molding having an uneven structure of a square truncated structure in accordance with example embodiments. FIG. 12 is a cross-sectional view taken along the line D-D' in FIG. 11.

Referring to FIGS. 11 and 12, an uneven structure 410 of a square truncated structure 414 may be formed by the second laser beam on the molding 400.

In example embodiments, the square truncated structure 414 may have an upper surface and a lower surface opposite to the upper surface. An area A1 of the upper surface may be smaller than an area A2 of the lower surface. As a height of the square truncated structure 414 increases, heat transfer efficiency may decrease. Since the area A1 of the upper surface is smaller than the area A2 of the lower surface, heat transmitted from the lower surface of the molding 400 may be quickly exposed to air from the upper surface. For example, a ratio (A1/A2) of the area A1 of the upper surface and the area A2 of the lower surface may be within a range of 0.5 to 0.9.

Figure 13:
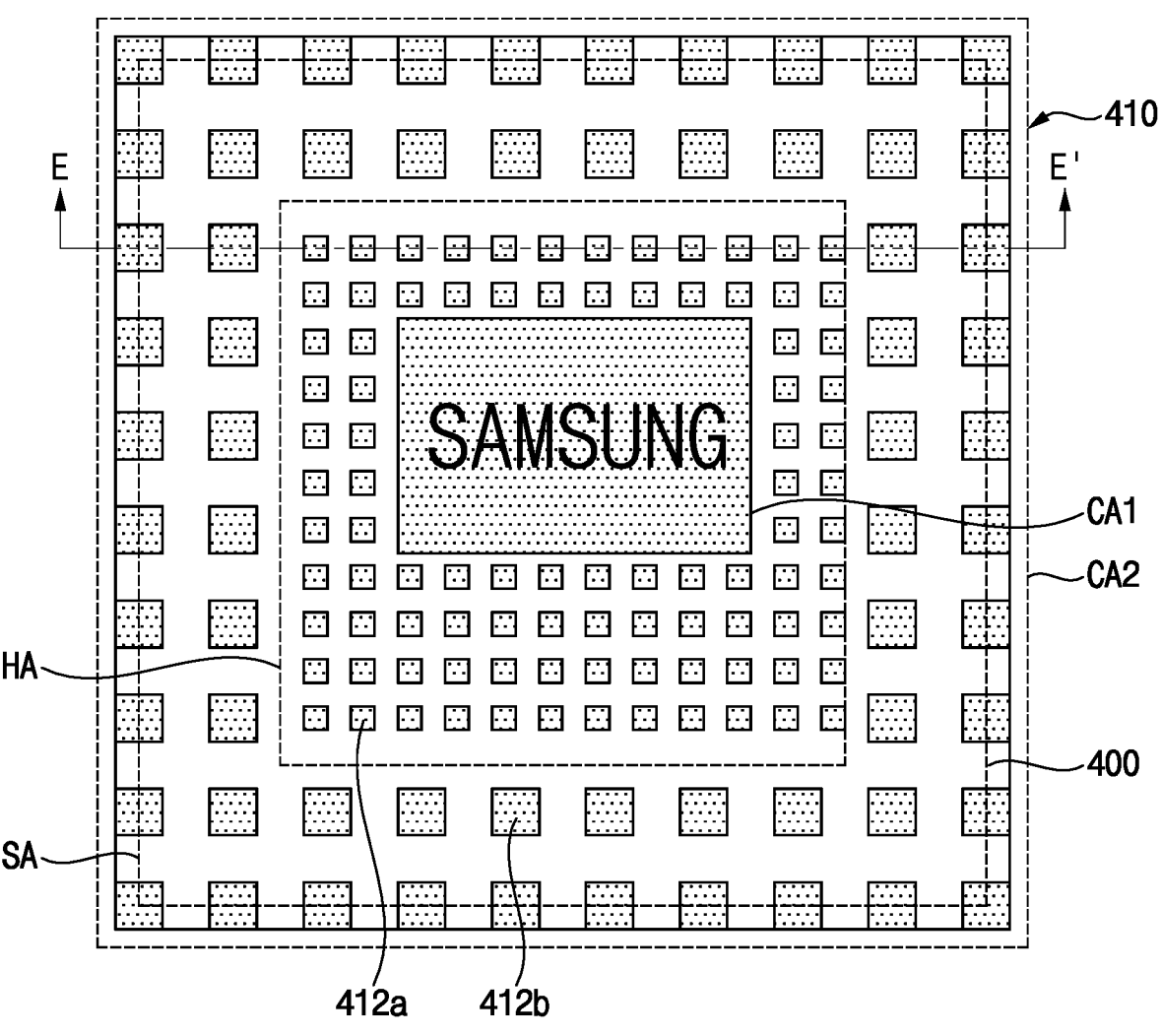
Figure 14:
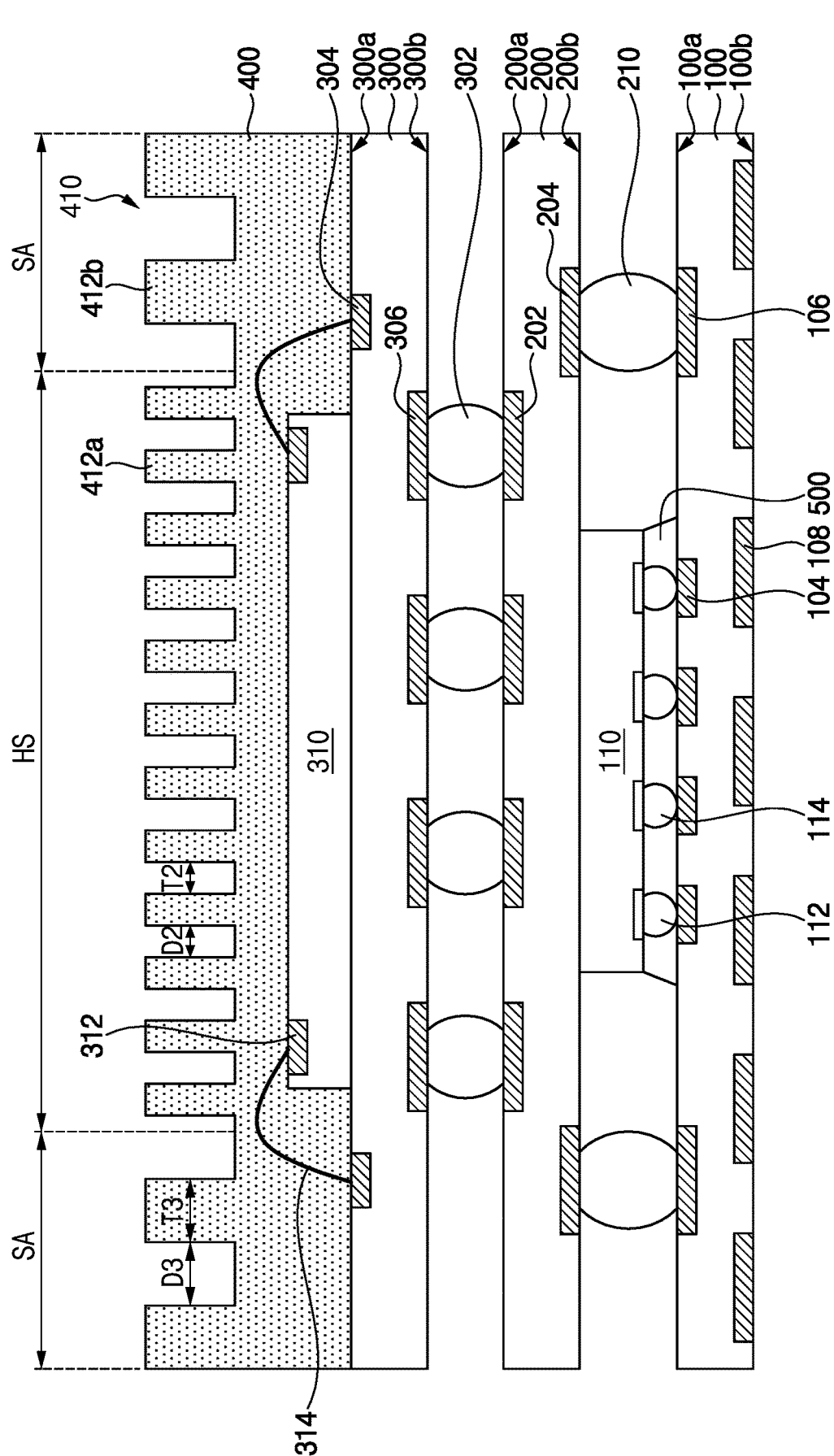

FIG. 13 is a plan view illustrating a semiconductor package including a molding having column structures intensively formed in a heat dissipation region in accordance with example embodiments. FIG. 14 is a cross-sectional view taken along the line E-E' in FIG. 13.

Referring to FIGS. 13 and 14, an uneven structure 410 may be formed by the second laser beam on the molding 400. The uneven structure 410 may include a plurality of column structures 412 formed on the upper surface of the molding 400. The column structures 412 may be densely formed in a heat dissipation region HA.

In example embodiments, the molding 400 may have the heat dissipation region HA that receives the most heat from the stacked semiconductor devices and a surrounding region SA surrounding the heat dissipation region HA. The heat dissipation region HA may be formed on the second region CA2.

For example, the heat dissipation region HA may have a region overlapping the second semiconductor device 310 in a plan view. The heat dissipation region HA may be a region that receives most of the heat from the second semiconductor device 310. The heat dissipation region HA may be a region that receives most of the heat from the lower surface of the molding 400.

The column structures 412 may include a first column structure 412a formed in the heat dissipation region HA and a second column structure 412b formed in the surrounding region SA. The first column structure 412a may have a second width T2. The second column structure 412b may have a third width T3 that is greater than the second width T2. For example, the second width T2 of the first column structure 412a may be within a range of 5 µm to 30 µm. The third width T3 of the second column structure 412b may be within a range of 15 µm to 50 µm.

The first column structures 412a may be spaced apart from each other by a second distance D2. The second column structures 412b may be spaced apart from each other by a third distance D3 that is greater than the second distance D2. For example, the second distance D2 between the first column structures 412a may be within a range of 51 µm to 30 µm. The third distance D3 between the second column structures 412b may be within a range of 15 µm to 50 µm.

The first column structures 412*a* may be closer to each other than the second column structures 412*b* in the heat dissipation region HA. The first column structures 412*a* densely formed in the heat dissipation region HA may dissipate more heat from the semiconductor package 10.

After the molding 400 covering the second semiconductor device 310 is formed, the uneven structure 410 having the column structures 412 may be formed on the molding 400 as a result of the use of the second laser beam. Accordingly, the column structures 412 may be formed in consideration of the heat dissipation region HA that varies depending on a type of the semiconductor package 10.

Figure 15:
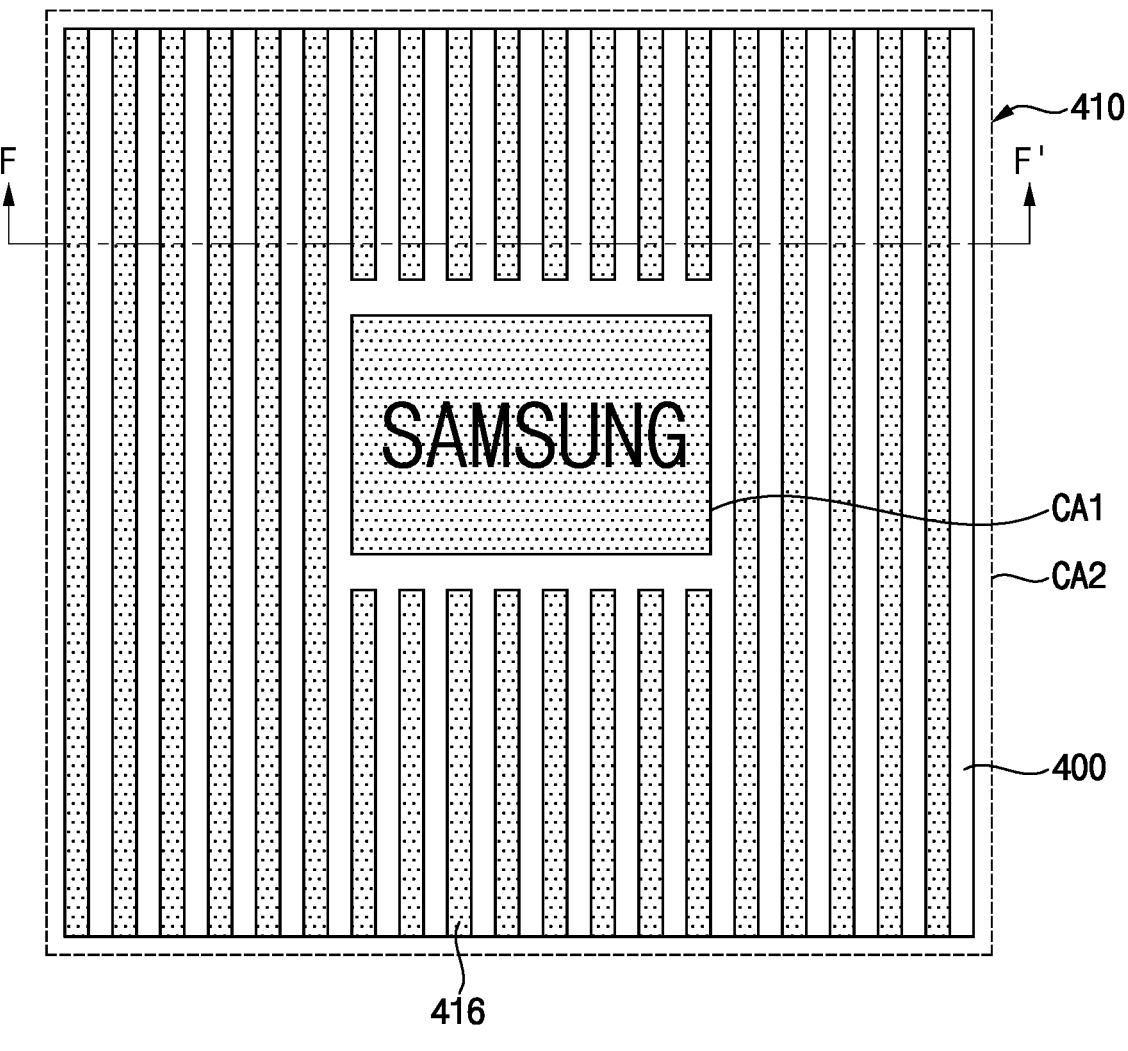
Figure 16:
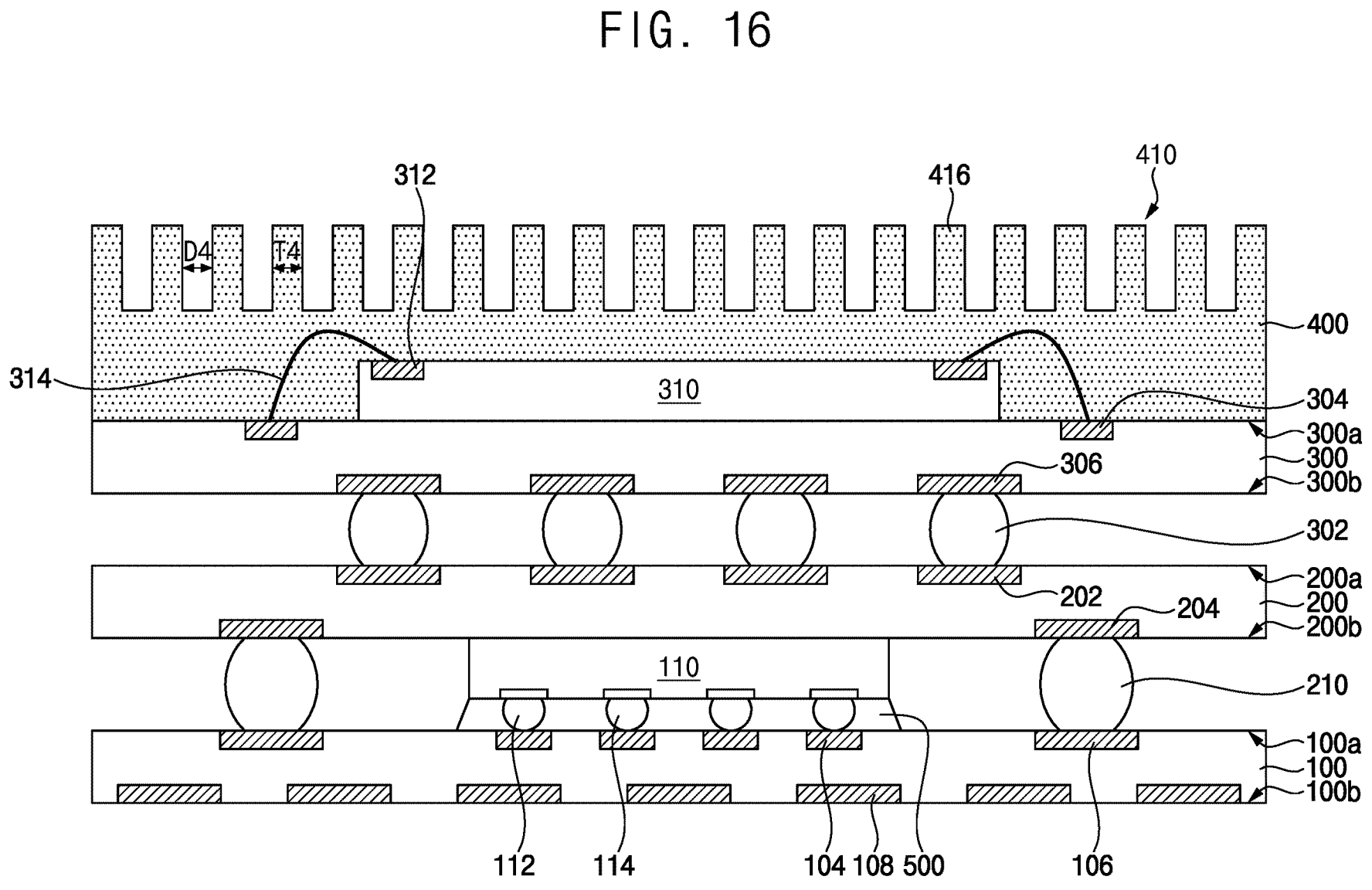

FIG. 15 is a plan view illustrating a semiconductor package including a molding having an uneven structure of a rod structure in accordance with example embodiments. FIG. 16 is a cross-sectional view taken along the line F-F' in FIG. 15.

Referring to FIGS. 15 and 16, the uneven structure 410 having rod structures 416 may be formed by the second laser beam on the molding 400.

In example embodiments, the upper surface of the molding 400 may be exposed by the second laser beam to form a plurality of rod structures 416 extending in a longitudinal direction of the molding 400. The rod structures 416 may extend parallel to each other in a same direction in the longitudinal direction of the molding 400.

The rod structures 416 may have a small width as a result of the use of the second laser beam. Since the rod structures 416 extend in one direction, the rod structures may be stronger than the column structures 412. Since the rod structures 416 are stronger than the column structures 412, they may have a fourth width T4 that is smaller than the first width T1 of the column structures 412. The distance between the rod structures 416 may have a fourth distance D4 smaller than the first distance D1 between the column structures 412. For example, the fourth width T4 may be within a range of 51 μm to 30 μm. The fourth distance D4 may be within a range of 5 μm to 30 μm.

Figure 17:
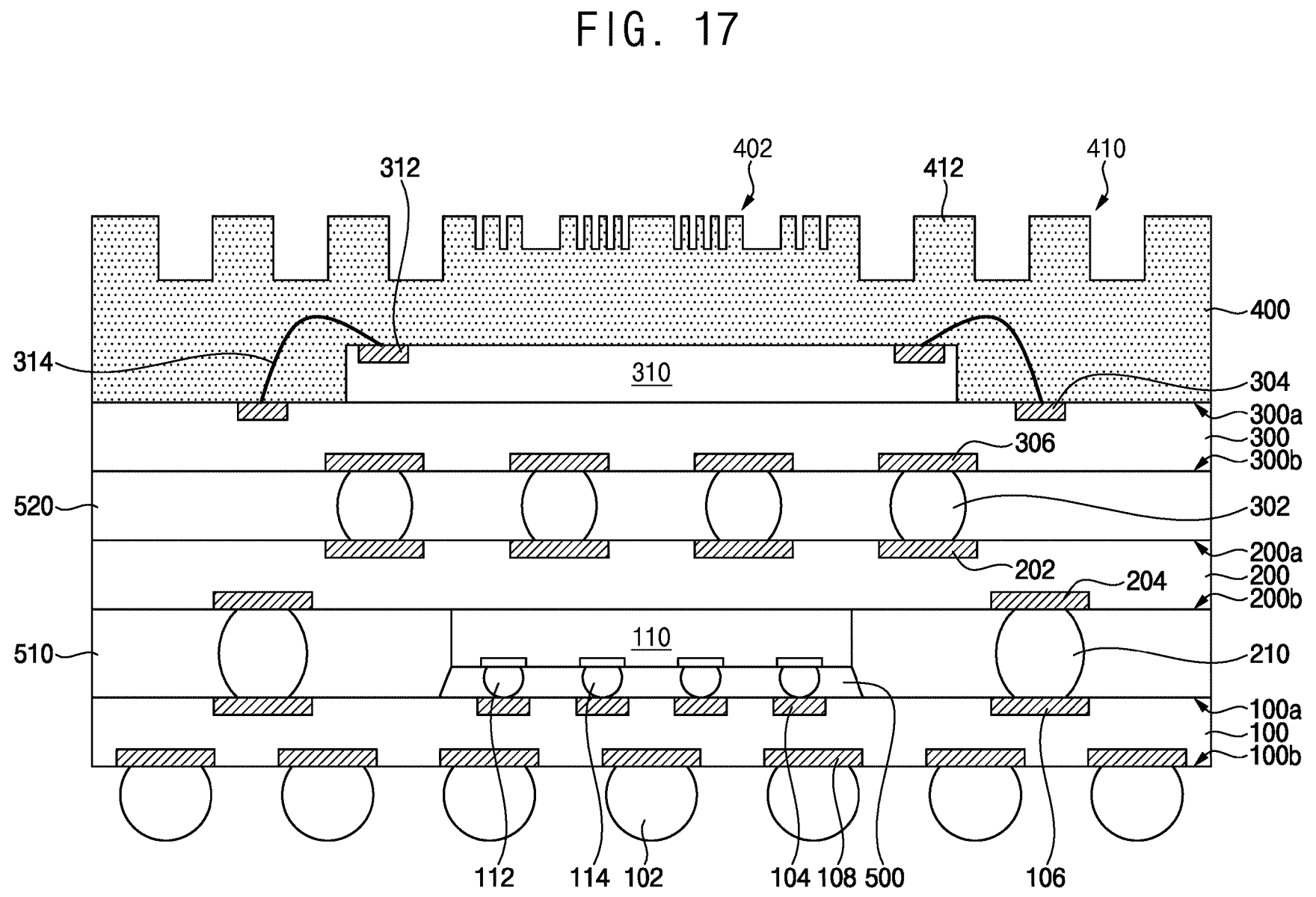

Referring to FIG. 17, a second adhesive 510 may be injected between the first package substrate 100 and the interposer 200, and a third adhesive 520 may be injected between the interposer 200 and the second package substrate 300. First conductive bumps 102 may be formed on the third substrate pads 108 of the first package substrate 100.

For example, the second adhesive 510 may include an epoxy material to reinforce a gap between the first package substrate 100 and the interposer 200. The second adhesive 510 may include the epoxy material to reinforce a gap between the interposer 200 and the second package substrate 300.

Then, the semiconductor package 10 in FIG. 1 may be completed by forming the first conductive bumps 102 such as solder balls on the third substrate pads 108 of the first package substrate 100, respectively.

The foregoing is illustrative of example embodiments and should not necessarily be construed as limiting thereof. Although a few example embodiments have been described, those skilled in the art will readily appreciate that many modifications are possible in example embodiments without materially departing from the present disclosure. Accordingly, all such modifications are intended to be included within the scope of the present disclosure.

What is claimed is:

1. A method of manufacturing a semiconductor package, comprising:

sequentially disposing a first semiconductor device and an interposer on a first package substrate;

disposing a second package substrate on the interposer via conductive bumps;

disposing a second semiconductor device on the second package substrate and forming a molding covering the second semiconductor device;

forming a marking pattern by a first laser beam on a first region of an upper surface of the molding; and forming an uneven structure by a second laser beam on a second region of the upper surface of the molding.

2. The method of claim 1, wherein the first laser beam has a first intensity, and the second laser beam has a second intensity that is different from the first intensity.

3. The method of claim 1, wherein forming the marking pattern includes applying the first laser beam for a first irradiation time, and forming the uneven structure includes applying the second laser beam for a second irradiation time.

4. The method of claim 1, wherein the molding includes an epoxy molding compound (EMC).

5. The method of claim 1, wherein forming the uneven structure further includes forming a plurality of rod structures extending parallel to each other in an extending direction of the molding.

6. The method of claim 1, wherein forming the uneven structure includes processing the upper surface of the molding to form a plurality of trenches that define a plurality of protruding column structures.

7. The method of claim 6, wherein each of the plurality of protruding column structures has a first height and a first width, wherein the first height is within a range of 10 μm to 30 μm, and wherein the first width is within a range of 15 μm to 50 μm.

8. The method of claim 6, wherein a distance between neighboring column structures of the plurality of column structures is within a range of 15 μm to 50 μm.

9. The method of claim 6, wherein each of the plurality of column structures has a truncated shape, and wherein a ratio (A1/A2) of an area A1 of an upper surface of the truncated shape to an area A2 of a lower surface of the truncated shape is within a range of 0.5 to 0.9.

10. The method of claim 6, wherein each of the plurality of column structures has a circular cone shape, a quadrilateral pyramid shape, a hemisphere shape, a circular truncated cone shape, or a frustum of quadrilateral pyramid shape.

11. A method of manufacturing a semiconductor package, comprising:

disposing an interposer on a first package substrate on which a first semiconductor device is stacked;

disposing a second package substrate on which a second semiconductor device is stacked, on the interposer;

forming a molding on the second package substrate covering the second semiconductor device;

forming a marking pattern by a first laser beam having a first intensity on a first region of an upper surface of the molding; and forming an uneven structure by a second laser beam, having a second intensity that is greater than the first intensity, on a second region of the upper surface of the molding.

12. The method of claim 11, wherein forming the marking pattern includes exposing the first region of the upper surface of the molding to the first laser beam for a first period of time, and forming the uneven structure includes exposing the second region of the upper surface of the molding to the second laser beam for a second period of time.

13. The method of claim 11, wherein the molding includes an epoxy molding compound (EMC).

14. The method of claim 11, wherein forming the uneven structure further includes forming a plurality of rod structures extending parallel to each other in an extending direction of the molding.

15. The method of claim 11, wherein forming the uneven structure includes processing the upper surface of the molding to form a plurality of trenches that define a plurality of protruding column structures.

16. The method of claim 15, wherein each of the plurality of protruding column structures has a first height and a first width, wherein the first height is within a range of 10 μm to 30 μm, and wherein the first width is within a range of 15 μm to 50 μm.

17. The method of claim 15, wherein a distance between neighboring column structures of the plurality of protruding column structures is within a range of 15 μm to 50 μm.

18. The method of claim 15, wherein each of the plurality of protruding column structures has a truncated shape, and wherein a ratio (A1/A2) of an area A1 of an upper surface of the truncated shape to an area A2 of a lower surface of the truncated shape is within a range of 0.5 to 0.9.

19. The method of claim 15, wherein each of the plurality of protruding column structures has a circular cone shape, a quadrilateral pyramid shape, a hemisphere shape, a circular truncated cone shape, or a frustum of quadrilateral pyramid shape.

* * * * *